United States Patent
Tihanyi

(10) Patent No.: US 7,199,403 B2
(45) Date of Patent: Apr. 3, 2007

(54) SEMICONDUCTOR ARRANGEMENT HAVING A MOSFET STRUCTURE AND A ZENER DEVICE

(75) Inventor: Jenö Tihanyi, Kirchheim (DE)

(73) Assignee: Infineon Technologies AG, Munich (DE)

(*) Notice: Subject to any disclaimer, the term of this patent is extended or adjusted under 35 U.S.C. 154(b) by 180 days.

(21) Appl. No.: 10/901,634

(22) Filed: Jul. 29, 2004

(65) Prior Publication Data

US 2005/0056886 A1   Mar. 17, 2005

(30) Foreign Application Priority Data

Jul. 30, 2003   (DE) .............................. 103 34 780

(51) Int. Cl.
*H01L 29/00*  (2006.01)

(52) U.S. Cl. ................... 257/106; 257/288; 257/551; 257/603; 257/E21.355

(58) Field of Classification Search ................ None
See application file for complete search history.

(56) References Cited

U.S. PATENT DOCUMENTS

2004/0251503 A1* 12/2004 Hayashi et al. ............. 257/368

FOREIGN PATENT DOCUMENTS

DE       1924207 B  *  1/1979
DE       101 23 818     9/2002

* cited by examiner

*Primary Examiner*—Leonardo Andujar
*Assistant Examiner*—Scott R. Wilson
(74) *Attorney, Agent, or Firm*—Dicke, Billig & Czaja, PLLC

(57) ABSTRACT

The invention relates to a semiconductor arrangement having a MOSFET structure and an active zener function. A $n^+$-doped zone and a $p^+$-doped zone are provided at the bottom of a trench for the purpose of forming zener diodes, the $n^+$-doped zone being directly connected to the gate electrode.

19 Claims, 2 Drawing Sheets

SEMICONDUCTOR ARRANGEMENT HAVING A MOSFET STRUCTURE AND A ZENER DEVICE

CROSS-REFERENCE TO RELATED APPLICATIONS

This Utility Patent Application claims priority to German Patent Application No. DE 103 34 780.1, filed on Jul. 30, 2003, which is incorporated herein by reference.

BACKGROUND

The present invention relates to a semiconductor arrangement having a MOSFET structure and a zener device provided between the gate and drain of the MOSFET structure. In this case, MOSFET structure is to be understood primarily as a MOSFET. However, an IGBT (insulated gate bipolar transistor), for example, is also regarded as such a MOSFET structure. Generally, however, any semiconductor component in which a current flow is controlled by means of an insulated control electrode has such a MOSFET structure.

As is known, in order to increase the robustness of power MOSFETS, it is possible to use the so-called "active zenering" (active zener function), in the case of which, as is illustrated in FIG. 1, a zener diode Z1 is located between a control electrode G and a drain electrode D. A diode D1 may also be provided in a manner reverse-connected in series with said zener diode Z1, the diodes Z1 and D1 being formed by corresponding pn junctions. One example of such active zenering is the so-called PROFET, in which a protective diode is provided between the gate electrode and drain electrode.

The effect of the active zenering is that in the event of an increased voltage that is present at the drain electrode D and exceeds the zener voltage of the zener diode Z1, the MOSFET is switched on again and a current flow occurs between the source electrode S and drain electrode D.

To date, active zenering in MOSFETs has been realized by means of a separate Zener diode or else in integrated form. However, the outlay for this is not inconsiderable since the formation of the zener diode requires additional area on the integrated circuit besides further doping steps.

SUMMARY

In one embodiment of the present invention, a semiconductor arrangement having a MOSFET structure and active zenering is provided that can be fabricated in a simple manner and is distinguished in particular by a minimal area requirement. Also, a method is specified for fabricating such a semiconductor arrangement.

In one embodiment, a semiconductor has a MOSFET structure with a trench MOSFET having a channel of the first conduction type and a gate electrode provided in a trench, and a zener device has a first highly doped zone of the first conduction type and a second highly doped zone of the second conduction type, opposite to the first conduction type, the two zones being provided in this order between the gate electrode and a drain region at the bottom of the trench.

In a semiconductor arrangement according to one embodiment of the invention, an $n^+$-conducting zone adjoins the gate electrode, which comprises $n^+$-doped polycrystalline silicon, for example, at the bottom of the trench. Said $n^+$-conducting zone is formed by diffusion from the polycrystalline silicon. Said $n^+$-conducting zone is then followed by a $p^+$-conducting zone which, for its part, is produced for example by ion implantation in the trench. The two zones, that is to say the $n^+$-conducting zone and the $p^+$-conducting zone that essentially surrounds the latter, are configured in insular fashion and are situated in the lower region of the trench. The pn junction between the $n^+$-conducting zone and the $p^+$-conducting zone forms a first zener diode. Furthermore, the pn junction between the $p^+$-conducting zone and the—in this case—n-conducting drain region forms a second zener diode. The two zener diodes are thus reverse-connected in series with one another.

The zener diodes may also be provided at other locations in the trench, for example at sidewalls.

It should be emphasized that the conduction types specified may also be respectively reversed. In other words, the n conduction type may be replaced by the p conduction type if the n conduction type is in turn used instead of the p conduction type.

In one embodiment, silicon is used as semiconductor material for the semiconductor arrangement. However, it is also possible to use other semiconductor materials such as, by way of example, silicon carbide, $A_{III}B_V$-semiconductors, etc.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
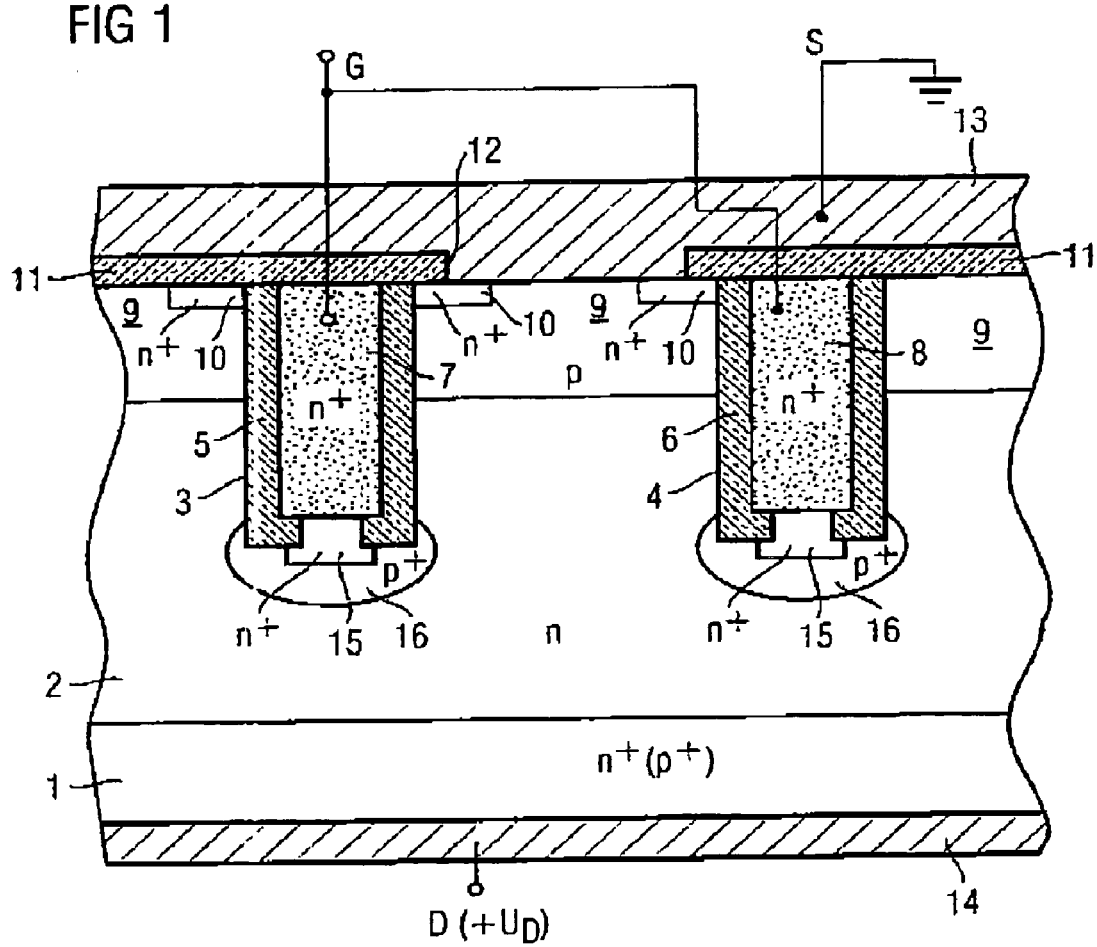
FIG. 1 illustrates a circuit diagram of a PROFET arrangement.
Figure 2:
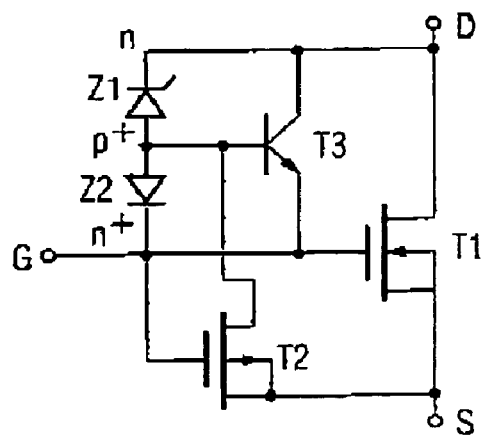
FIG. 2 illustrates a sectional illustration through an exemplary embodiment of the semiconductor arrangement according to one embodiment of the invention.

FIG. 2 illustrates an exemplary embodiment of the semiconductor arrangement according to one embodiment of the invention. Two trench MOSFETS are shown in the case of this exemplary embodiment. However, the number of trench MOSFETS is not limited to two. Rather, this number may also be higher. However, it goes without saying that just one trench MOSFET may also be present instead of linear structures. Furthermore, a ring structure may also be chosen for the trench MOSFET. In this case, the trench surrounds an inner body region, so that the schematic connection between the two gate electrodes that is illustrated in FIG. 2 may be obviated. In other words, the gate electrode then has an annular configuration. However, other geometrical forms are also possible for the trench MOSFET.

In detail, FIG. 2 illustrates an n+-conducting semiconductor substrate 1, on which an n-conducting semiconductor layer 2 is provided. Trenches 3, 4 are introduced into the semiconductor layer 2 and are lined with an insulting layer 5, 6 made of silicon dioxide, for example, as gate oxide. Moreover, the interior of the trenches 3, 4 is filled with n+-doped polycrystalline silicon (polysilicon) 7, 8. A p-doped body region 9 is situated in the region between the trenches 3, 4 and, if appropriate, on both sides thereof n+-doped source zones 10 are introduced into said body region 9. The source zones 10 may, if appropriate, annularly surround the trenches 3, 4. Provided on the surface of the semiconductor arrangement configured in this way is an insulating layer 11 made of silicon dioxide, for example, which has a window 12, through which a metallization 13 makes contact with the source zones 10 and the body region 9. Said metallization 13 may comprise aluminum, for example, and be at reference-ground potential. The semiconductor substrate 1, which forms the drain zone together with the semiconductor layer 2, is likewise provided with a metallization 14 and is at a voltage $+U_D$, that is to say a positive drain voltage.

According to one embodiment of the invention, an n+-conducting zone 15 and a p+-conducting zone 16 surrounding the latter are provided in the bottom of the trenches 3, 4. In this case, the zones 15 are in contact with the polycrystalline silicon 7 of the trench 3 and, respectively, with the polycrystalline silicon 8 of the trench 4.

Figure 3:
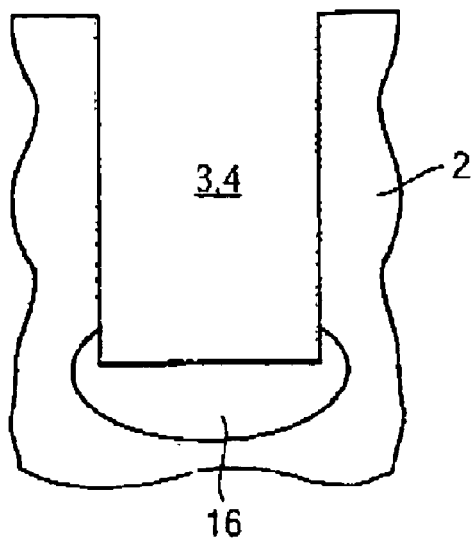
FIG. 3 illustrates an equivalent circuit diagram with respect to the semiconductor arrangement of FIG. 2.

FIG. 3 illustrates an equivalent circuit diagram for the semiconductor arrangement of FIG. 2. The zener diode Z1 is formed by the pn junction between the zones 15 and 16, while the zener diode Z2 corresponds to the pn junction between the zone 16 and the layer 2. The n-channel MOSFET T1 comprises the source zone 10, the body region 9 and the drain zone made of the substrate and the semiconductor layer 2, while the p-channel MOSFET T2 is formed by the body region 9, the semiconductor layer 2 and the zone 16. Furthermore, the bipolar transistor T3 corresponds to the layer sequence made of the zone 15 as emitter, the zone 16 as base and the layer 2 and also the substrate 1 as collector.

The parasitic npn bipolar transistor T3 should have a low current gain β. This usually holds true for such transistors. Therefore, its collector-emitter voltage $U_{CE0}$ reduces the dielectric strength of the semiconductor arrangement only to a very small extent. In other words, parasitic bipolar effects are scarcely manifested.

If the gate voltage present at the gate electrode G is higher than the zener voltage of the diode Z2, then holes are injected into the zone 15 under the trenches 3, 4, thereby further improving the conductivity of the semiconductor arrangement. This effect may be advantageous, for example, in the case of an IGBT in order to reduce the ON voltage drop, that is, to say the voltage drop in the switched-on state. Such an IGBT is present if a p+-doped semiconductor substrate is used instead of the n+-conducting substrate 1.

Figure 4:
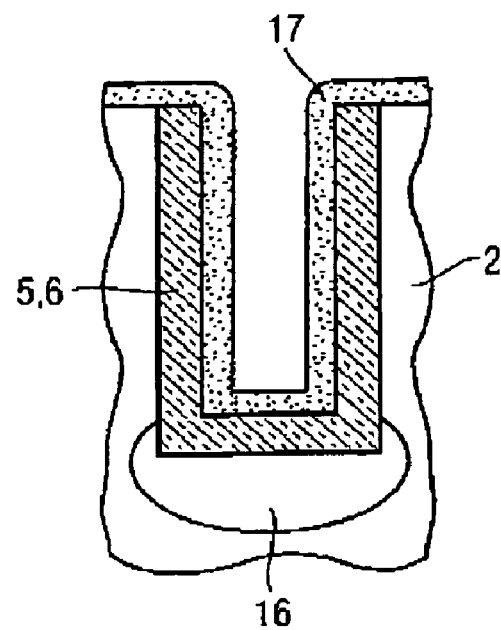
FIGS. 4–6 are sectional illustrations for elucidating the method according to one embodiment of the invention.
Figure 5:
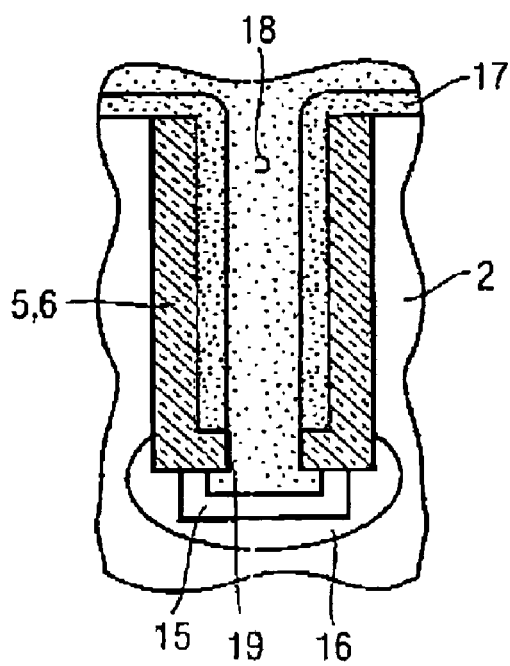
Figure 6:
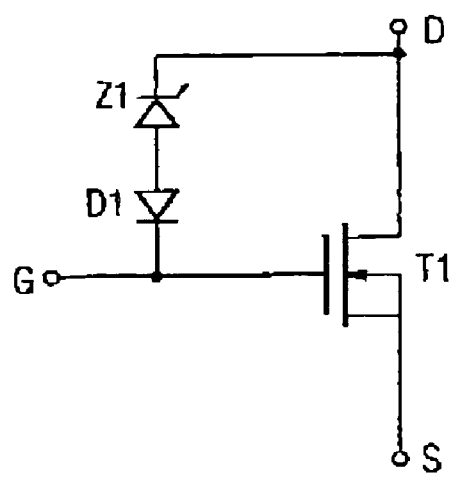

A method for fabricating the semiconductor arrangement according to one embodiment of the invention will be explained below with reference to FIGS. 4–6.

The trench 3 or 4 is introduced into the semiconductor layer 2 by etching. The p+-conducting zone 16 is then formed by ion implantation at the bottom of the trench 3 or 4. The structure is illustrated in FIG. 4.

The interior of the trench 3 or 4 is then lined with the insulating layer 5 or 6 by oxidation. A polycrystalline silicon layer 17 (poly1) is subsequently applied. The structure is illustrated in FIG. 5.

At the bottom of the rest of the trench 3 or 4, a hole is then introduced through the layers 17 and 5 or 6, and the interior of the trench is filled with polycrystalline silicon 18 (poly2). From this Poly2, the zone 15 is then outdiffused. Poly1 and poly2, that is say the layer 17 and the polycrystalline silicon 18, together form the polycrystalline silicon 7 or 8. The structure is illustrated in FIG. 6 is then present.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor arrangement having a MOSFET structure and a zener device provided between a gate and a drain of the MOSFET structure, comprising:

the MOSFET structure, which further comprises a trench MOSFET having a channel of a first conduction type and a gate electrode provided in a trench, and the zener device, which further comprises a first highly doped zone of the first conduction type and a second highly doped zone of a second conduction type, opposite to the first conduction type, the two zones being located in this order between the gate electrode and a drain region of the MOSFET.

2. The semiconductor arrangement of claim 1, wherein the two zones are provided at the bottom of the trench.

3. The semiconductor arrangement of claim 1, wherein the MOSFET structure is extended by a zone of the second conduction type to form an IGBT.

4. The semiconductor arrangement of claim 1, wherein a plurality of trenches are provided.

5. The semiconductor arrangement of claim 1, wherein the trench has a ring structure.

6. The semiconductor arrangement of claim 1, wherein the zone of the first conduction type is connected to the gate electrode through a hole in a trench insulating layer.

7. The semiconductor arrangement of claim 1, wherein the gate electrode comprises polycrystal line silicon doped with the first conduction type.

8. The semiconductor arrangement of claim 1, wherein the first conduction type is the n conduction type.

9. The semiconductor arrangement of claim 1, wherein the zone of the second conduction type completely encloses the zone of the first conduction type.

10. The semiconductor arrangement of claim 1, wherein the zone of the first conduction type and the zone of the second conduction type are in each case configured in insular fashion within the trench.

11. A semiconductor arrangement comprising:

a trench MOSFET having a gate and a drain, and further having a trench and a channel of a first conduction type wherein a gate electrode is provided in the trench; and a zener device provided between the gate and the drain of the trench MOSFET, the zener device having a first highly doped zone of the first conduction type and a second highly doped zone of a second conduction type, opposite to the first conduction type, the first and second zones being located between the gate electrode and the drain of the trench MOSFET.

12. The semiconductor of claim 11, wherein the fast highly doped zone is located adjacent the gate electrode and the second highly doped zone is located adjacent the drain.

13. The semiconductor arrangement of claim 11, wherein the two zones are provided at the bottom of the trench.

14. The semiconductor arrangement of claim 11, wherein the trench MOSFET is extended by a zone of the second conduction type to form an IGBT.

15. Tho semiconductor arrangement of claim 11, wherein a plurality of trenches are provided.

16. The semiconductor arrangement of claim 11, wherein the trench has a ring structure.

17. The semiconductor arrangement of claim 11, wherein the zone of the first conduction type is connected to the gate electrode through a hole in a trench insulating layer.

18. The semiconductor arrangement of claim 11, wherein the gate electrode comprises polycrystalline silicon doped with the first conduction type.

19. The semiconductor arrangement of claim 11, wherein the first conduction type is the n conduction type.

* * * * *